United States Patent
Mikami et al.

(10) Patent No.: US 6,964,086 B2
(45) Date of Patent: Nov. 15, 2005

(54) METHOD OF MANUFACTURING THIN FILM PIEZOELECTRIC ELEMENT, AND ELEMENT HOUSING JIG

(75) Inventors: Hirosuke Mikami, Osaka (JP); Hirokazu Uchiyama, Osaka (JP); Hideki Kuwajima, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 366 days.

(21) Appl. No.: 10/373,774

(22) Filed: Feb. 27, 2003

(65) Prior Publication Data

US 2003/0173021 A1 Sep. 18, 2003

(30) Foreign Application Priority Data

Mar. 4, 2002 (JP) ........................... 2002-057234

(51) Int. Cl.$^7$ .............. H04R 17/00; C23F 1/00
(52) U.S. Cl. .............. 29/25.35; 29/830; 216/2; 216/22; 156/235; 156/239
(58) Field of Search .............. 29/25.35, 830; 310/348, 353; 156/235, 239, 241, 247, 344

(56) References Cited

U.S. PATENT DOCUMENTS 5,334,999 A * 8/1994 Kashiwazaki et al. ........ 347/65
5,412,865 A * 5/1995 Takaoka et al. ............ 29/830
5,619,234 A * 4/1997 Nagato et al. ............. 347/55
5,767,930 A * 6/1998 Kobayashi et al. .......... 349/42
6,308,405 B1 * 10/2001 Takamatsu et al. ......... 29/830

FOREIGN PATENT DOCUMENTS

| JP | 05325274 | 12/1993 |
|----|----------|---------|
| JP | 2002134807 | 5/2002 |

* cited by examiner

Primary Examiner—A. Dexter Tugbang
Assistant Examiner—Tai Van Nguyen
(74) Attorney, Agent, or Firm—Wenderoth, Lind & Ponack, L.L.P.

(57) ABSTRACT

A method comprises: bonding a plurality of thin film piezoelectric elements, formed on a substrate, onto a temporary fixing substrate via an adhesive layer; selectively removing the substrate to expose the thin film piezoelectric elements; fixing an element housing jig having sectional regions for individually isolating the thin film piezoelectric elements in such manner that the thin film piezoelectric elements and the sectional regions correspond to each other; and dissolving and removing the adhesive layer, and housing the thin film piezoelectric elements in the sectional regions of the element housing jig. Accordingly, it is possible to individually isolate and house the thin film piezoelectric elements removed from the substrate.

10 Claims, 12 Drawing Sheets

METHOD OF MANUFACTURING THIN FILM PIEZOELECTRIC ELEMENT, AND ELEMENT HOUSING JIG

FIELD OF THE INVENTION

The present invention relates to a method of manufacturing a thin film piezoelectric element for an actuator used for positioning a head, or the like, of a disk recording and reproducing apparatus (hereinafter called disk unit), and an element housing jig used for manufacturing the thin film piezoelectric element.

BACKGROUND OF THE INVENTION

In recent years, disk recording density of a disk unit has been increased at a rate of 10% per year. A head for recording and reproducing data on a disk is generally mounted on a slider. The slider with a head mounted thereon is fixed to a side opposing the disk at one end of an actuator arm. At another end of the actuator arm is disposed a voice coil motor (hereinafter called VCM). The actuator arm is rotated by the VCM, thereby positioning the head to a predetermined track position of the disk for performing a recording or reproducing operation.

For recording data on a disk at higher densities, it is necessary to position the head against the disk with greater accuracy. However, with a configuration in which the actuator arm is rotated by the VCM for positioning the head, it is very difficult to further improve head positioning accuracy. On the other hand, in Japanese Laid-open Patent 2002-134807, besides a system for rotating an actuator arm by a conventional VCM, a two-step actuator system using a piezoelectric actuator with paired thin film piezoelectric elements, fixed on a flexure with a head, is proposed for highly accurate positioning of the head to a predetermined track position.

A method of manufacturing the paired thin film piezoelectric elements will briefly be described in the following. First, a surface electrode layer of platinum (Pt) or the like is formed on a substrate such as magnesium oxide monocrystalline substrate (MgO substrate), followed by forming a lead zirconate titanate (PZT) layer, and further, on the PZT layer is formed an upper electrode layer of Pt or gold (Au). Two substrates provided with these layers are prepared, and the upper electrodes are bonded to each other by using an adhesive agent. Subsequently, one of the substrates is removed by etching, and the remaining structure is processed into a desired shape by photolithography and an etching process. Finally, the other substrate is removed by etching and resulting is a single structure of a thin film piezoelectric element, which is secured by bonding to the flexure.

FIG. 10 and FIG. 11A to FIG. 11C depict steps in which, after performing main portions of this manufacturing method, a plurality of thin film piezoelectric elements are formed on a substrate, and the substrate is removed by etching to separate the thin film piezoelectric elements from the substrate. As shown in FIG. 10, a plurality of thin film piezoelectric elements 80 are formed on substrate 91, such as an MgO substrate. FIG. 10 is a plan view as viewed from above the substrate 91. Also, FIG. 11A to FIG. 11C are sectional views.

To separate these thin film piezoelectric elements 80 from the substrate 91, the thin film piezoelectric elements 80 are bonded by adhesive layer 92 onto a temporary fixing substrate 93 together with the substrate 91. This is shown in FIG. 11A. Next, in a state that the temporary fixing substrate 93 and the substrate 91 are bonded to each other by the adhesive layer 92, the substrate 91 is removed by etching. This is shown in FIG. 11B. In so doing, it is required to select an etching solution for etching the substrate 91, which does not cause the temporary fixing substrate 93 and the adhesive layer 92 to be etched. Thereafter the entire structure of the temporary fixing substrate 93, along with the thin film piezoelectric elements 80 bonded thereto is immersed into a chemical solution tank (not shown) to dissolve the adhesive layer 92 in the chemical solution tank. Then the thin film piezoelectric elements 80, in a state of being separated from the substrate 91 and the temporary fixing substrate 93, are obtained. This is shown in FIG. 11C. It is necessary to select a chemical solution for etching the adhesive layer 92, which does not cause the thin film piezoelectric elements 80 to be etched.

However, in such a conventional manufacturing method, with the adhesive layer 92 dissolved in the chemical solution tank, the thin film piezoelectric elements 80 will be separated into individual pieces in the chemical solution tank. Consequently, the thin film piezoelectric elements come into contact with each other and may be sometimes damaged. Further, although it is not shown, during a cleaning process executed subsequently, the thin film piezoelectric elements similarly come into contact with each other and may be sometimes damaged. Also, after the thin film piezoelectric elements 80 are inspected on the substrate 91, if they are separated into individual pieces in the chemical solution tank, it will make discrimination from this inspection difficult. Therefore, there arises a problem in that the separated piezoelectric elements must be individually inspected. Further, it is difficult to automate an operation to remove the thin film piezoelectric elements 80, as loose pieces, from the chemical solution tank or a cleaning tank.

SUMMARY OF THE INVENTION

The present invention is intended to solve the above problems, and a purpose of the invention is to provide a method of manufacturing thin film piezoelectric elements such that the thin film piezoelectric elements do not come into contact with each other in a chemical solution tank or a cleaning tank, whereby the thin film piezoelectric elements can be prevented from being damaged, and such that operations to handle the piezoelectric elements in the solution tank and to remove them from the solution tank are facilitated, thereby improving workability and greatly enhancing yield. Another purpose of the invention is to provide an element housing jig used for manufacturing the thin film piezoelectric elements.

A method of manufacturing thin film piezoelectric elements of the present invention comprises the steps of:

bonding a plurality of thin film piezoelectric elements, formed on a substrate, onto a temporary fixing substrate via an adhesive layer, and holding the thin film piezoelectric elements between the substrate and the temporary fixing substrate;

selectively removing the substrate to expose the thin film piezoelectric elements;

fixing an element housing jig having sectional regions for individually isolating the thin film piezoelectric elements in such a manner that the thin film piezoelectric elements and the sectional regions correspond to each other, respectively; and arranging the element housing jig in a vertically downward direction, dissolving and removing the adhesive layer, and receiving the thin film piezoelectric elements in the sectional regions of the element housing jig, respectively.

By this manufacturing method, when the thin film piezoelectric elements are separated from the substrate, it is possible to house the piezoelectric elements in a state of being isolated from each other. As a result, the thin film piezoelectric elements can be prevented from coming into contact with each other and being damaged. Also, since an arrangement of the thin film piezoelectric elements can be maintained as it is on the substrate, only non-defective ones of the piezoelectric elements can be mounted by chucking them from the element housing jig in accordance with a result of characteristic inspection of the piezoelectric elements while on the substrate. Accordingly, it is possible to greatly improve mass-productivity of thin film piezoelectric elements and to enhance yield thereof.

Also, the element housing jig of the present invention includes the following configuration:

a configuration that comprises sectional regions for isolating thin film elements according to arrangement of the thin film elements as formed on a substrate, and a flat-form base portion which maintains the sectional regions, wherein the sectional regions each comprise projections whose height is greater than a thickness of the base portion and thin film elements, each of the thin film elements is arranged in only one of the sectional regions, and movement of each thin film element out of its corresponding sectional region is restricted.

With this configuration, it is possible to individually and separately hold the thin film elements with respect to each other after the thin film elements have been separated from a substrate, which thin film elements can be and used as thin film piezoelectric elements. Accordingly, the element housing jig of the present invention will bring about excellent effects such as considerable improvement of yield and mass-productivity of thin film elements.

DETAILED DESCRIPTION OF THE EXEMPLARY EMBODIMENTS

The exemplary embodiments of the present invention will be described in the following with reference to the drawings.

First Exemplary Embodiment

Figure 1:
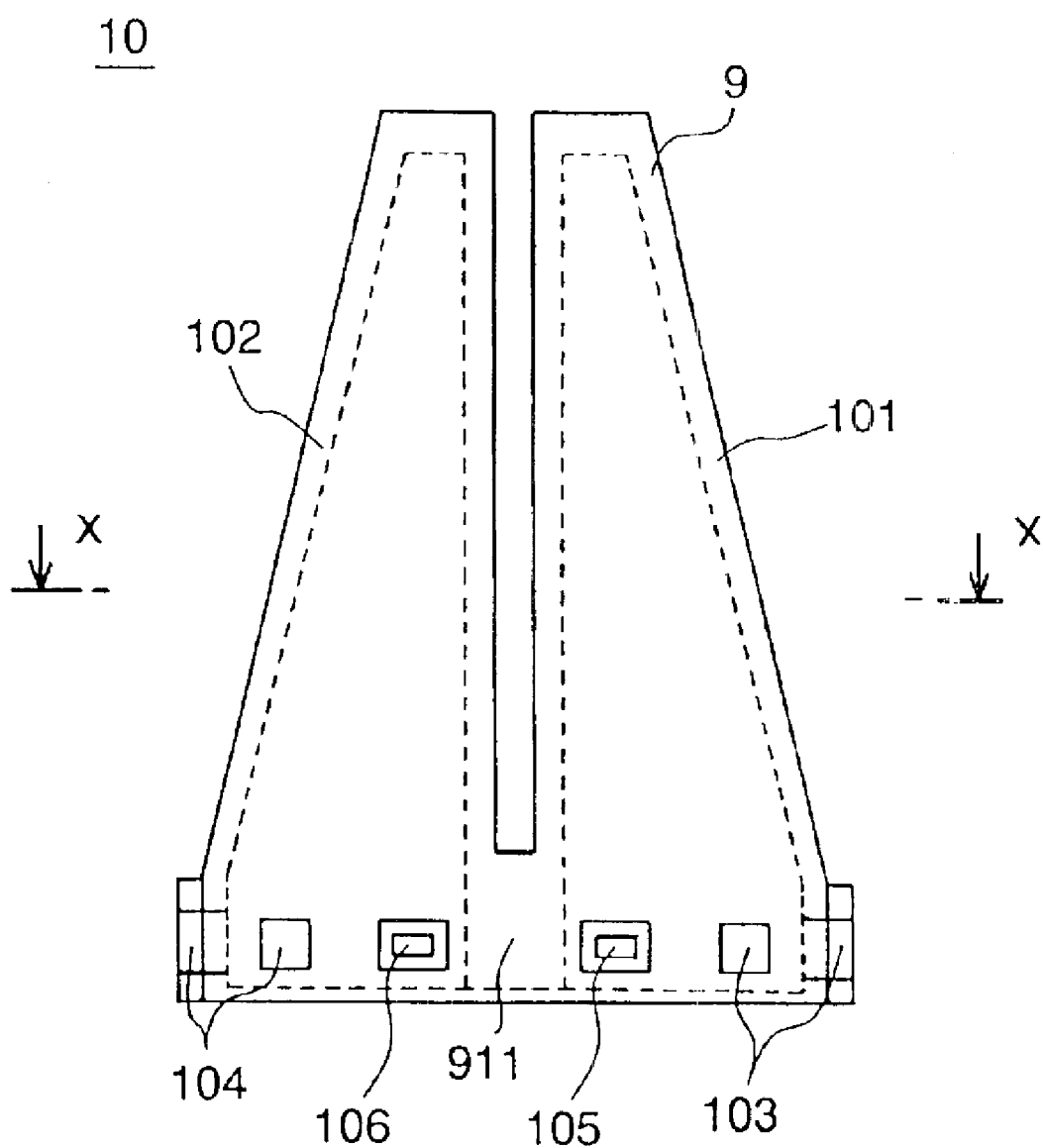
FIG. 1 is a plan view showing an example of a thin film piezoelectric element manufactured by a manufacturing method of a first exemplary embodiment of the present invention.
Figure 2:
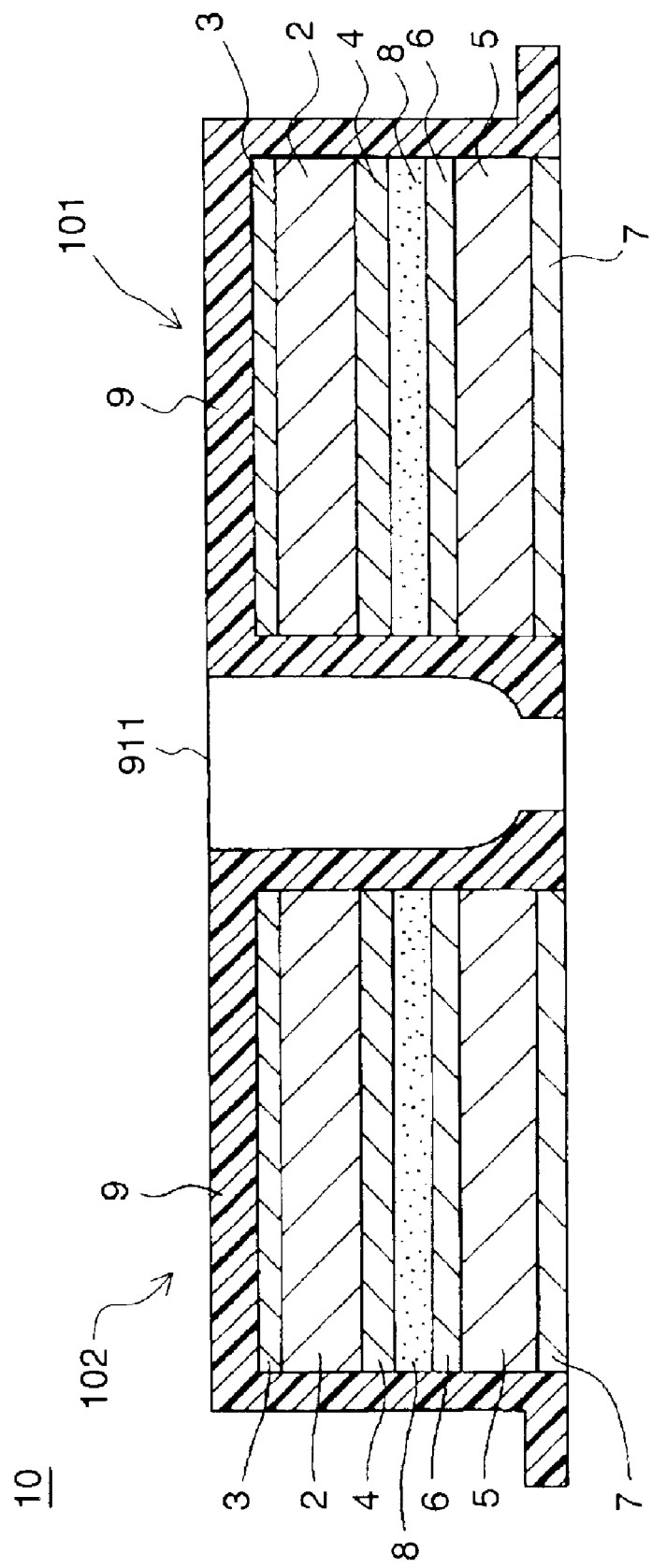
FIG. 2 is a sectional view along the X—X line shown in FIG. 1.

FIG. 1 is a plan view showing an example of paired thin film piezoelectric elements formed by a manufacturing method of a first exemplary embodiment of the present invention. Also, FIG. 2 is a sectional view along the X—X line of FIG. 1. By using these figures, structure of a thin film piezoelectric element 10 is briefly explained in the following. In the thin film piezoelectric element 10, a right piezoelectric element 101 and a left piezoelectric element 102, which are symmetrical with regard to one another, are covered with coating resin 9.

As shown in FIG. 2, the right piezoelectric element 101 and the left piezoelectric element 102, forming the thin film piezoelectric element 10, are each formed of a laminate structure including a first thin film piezoelectric material 2 and a second thin film piezoelectric material 5. The first thin film piezoelectric material 2 is provided with a first electrode layer 3 and a third electrode layer 4 formed on opposite surfaces thereof. Similarly, the second thin film piezoelectric material 5 is provided with a second electrode layer 7 and a fourth electrode layer 6 formed on opposite surfaces thereof. The first thin film piezoelectric material 2 and the second thin film piezoelectric material 5, with electrode layers formed on opposite surfaces thereof, are bonded by adhesive layer 8 with the third electrode layer 4 and the fourth electrode layer 6 opposed to each other. In this exemplary embodiment, the third electrode layer 4 and the fourth electrode layer 6 are electrically short-circuited, for example, by the adhesive layer 8 using conductive adhesive. A surface of such laminate structure is covered with flexible coating resin 9. Further, as shown in FIG. 1 and FIG. 2, the coating resin 9 includes a connecting portion 911 formed by the coating resin 9 for interconnecting the right thin film piezoelectric element 101 and the left thin film piezoelectric element 102 at positions close to electrode terminals.

Also, for application of a voltage to the thin film piezoelectric materials of the right piezoelectric element 101 and the left piezoelectric element 102, there are provided electrode terminals 103, 104, 105, 106. The electrode terminals 103, 104 are electrode pads for electrically connecting the first electrode layer 3 and the second electrode layer 7 to external equipment, while the electrode terminals 105, 106 are electrode pads for electrically connecting the third electrode layer 4 and the fourth electrode layer 6 similarly to external equipment.

A method of manufacturing such paired thin film piezoelectric elements will be described in the following.

Figure 3A:
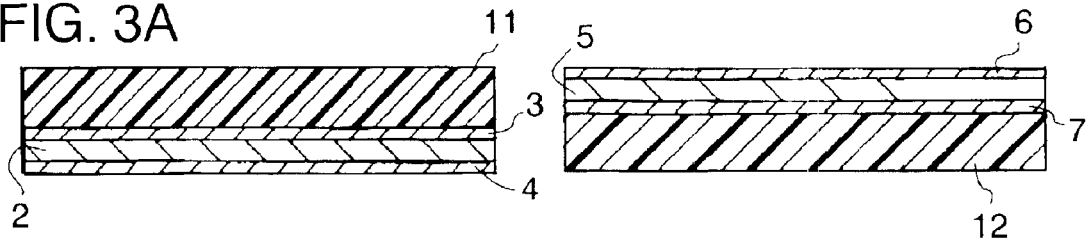
FIG. 3A is a block diagram especially for a description of a film forming process on a substrate in a process of manufacturing a thin film piezoelectric element by the manufacturing method of the first exemplary embodiment of the present invention.

In FIG. 3A, the first electrode layer 3, the first thin film piezoelectric material 2 and the third electrode layer 4, and the second electrode layer 7, the second thin film piezoelectric material 5 and the fourth electrode layer 6 are sequentially formed on substrates 11, 12, such as MgO substrates, respectively. These thin layers can be formed by using generally well-known technology. For example, thin film piezoelectric materials 2, 5, polarized in a direction vertical to the substrates 11, 12, can be easily obtained by employing a sputtering process to form a PZT layer as the thin film piezoelectric materials 2, 5, a Pt layer as the first electrode layer 3 and the second electrode layer 7, and a laminated layer of tantalum (Ta) and gold (Au) as the third electrode layer 4 and the fourth electrode layer 6.

Figure 3B:
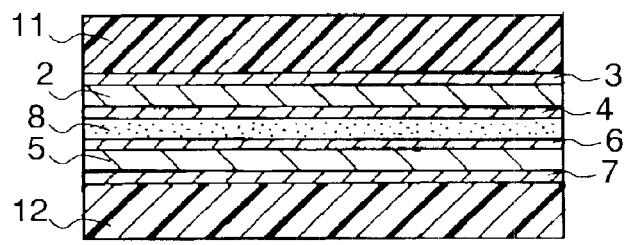
FIG. 3B shows a state of bonding by an adhesive layer during the manufacturing method of the first exemplary embodiment of the present invention.

Next, as shown in FIG. 3B, a laminated thin film is formed between the substrates 11, 12 by bonding the third electrode layer 4 to the fourth electrode layer 6 via adhesive layer 8.

Figure 3C:
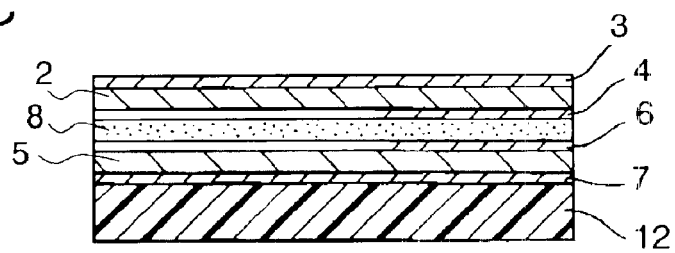
FIG. 3C shows a state with one substrate removed by etching during the manufacturing method of the first exemplary embodiment of the present invention.

Further, as shown in FIG. 3C, one of the two substrates 11, 12 is etched to expose a laminated thin film surface. In FIG. 3C, the substrate 11 is removed by etching. When etching the substrate 11, it is necessary to protect the substrate 12 with resin or the like so that this substrate will not be exposed to an etching solution. Also, it is necessary to select the etching solution and material for the first electrode layer 3 so that at least the first electrode layer 3 is not etched by the etching solution.

Figure 3D:
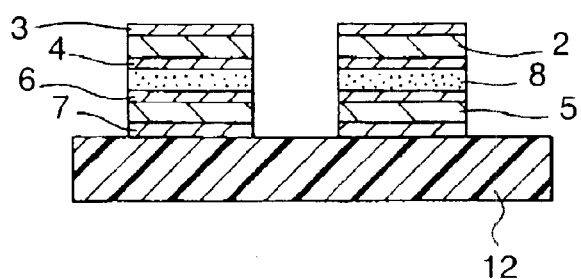
FIG. 3D shows a state of desired pattern forming on a substrate during the manufacturing method of the first exemplary embodiment of the present invention.

After exposing the laminated thin film surface in this way, the laminated thin film is processed into a shape as shown in FIG. 1 and FIG. 2 by using a photolithography process and etching process. At this time, electrode pads 103, 104, 105, 106 as shown in FIG. 1 are also formed. A processed state is shown in FIG. 3D.

Figure 3E:
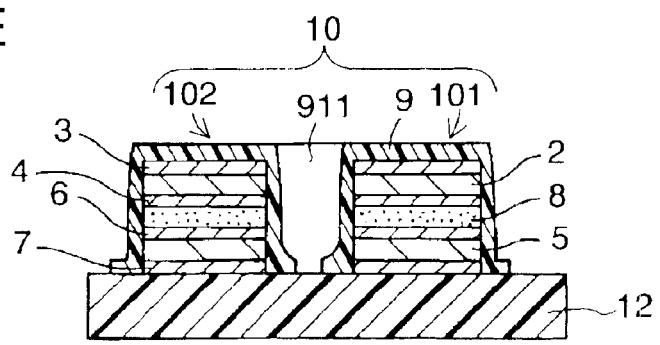
FIG. 3E shows a state of paired thin film piezoelectric elements with coating resin formed thereon during the manufacturing method of the first exemplary embodiment of the present invention.

Further, as shown in FIG. 3E, coating resin 9 covering the right piezoelectric element 101 and the left piezoelectric element 102, and connecting portion 911 for their integration are formed. The coating resin 9 is bored by etching or the like so as not to be formed over the electrode pads 103, 104, 105, 106.

Thus, specified processing on the substrate 12 is completed. A step of separating thin film piezoelectric element 10 from the substrate 12 will be described in the following.

Figure 4:
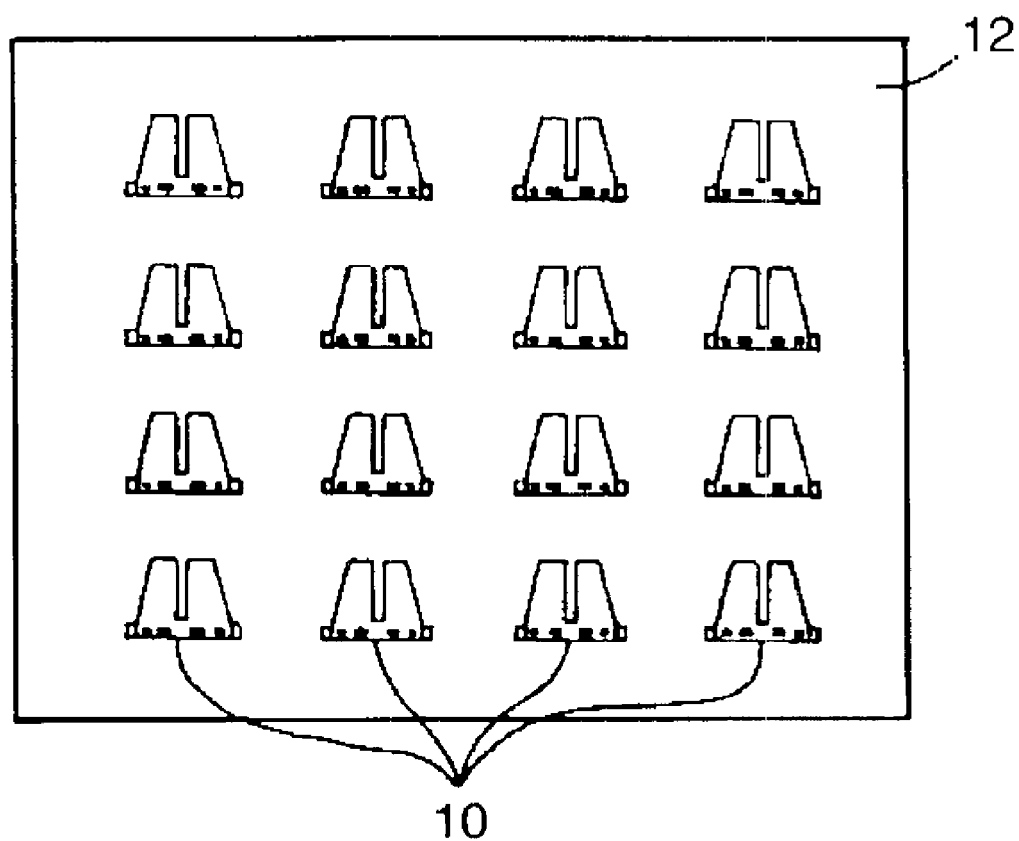
FIG. 4 shows a plurality of thin film piezoelectric elements formed on a substrate during the manufacturing method of the first exemplary embodiment of the present invention.

In the block diagrams of FIG. 3A to FIG. 3E, only one piece of thin film piezoelectric element 10 formed on the substrate 12 is shown. Actually, however, a plurality of thin film piezoelectric elements 10 are formed at specified intervals on the substrate 12 as shown in FIG. 4. In steps after separating the thin film piezoelectric element 10 from the substrate 12, description will be given with respect to a configuration having a plurality of thin film piezoelectric elements 10.

FIG. 5A to FIG. 5D are diagrams for description of main steps in a manufacturing method for separating the thin film piezoelectric elements 10 from the substrate 12.

Figure 5A:
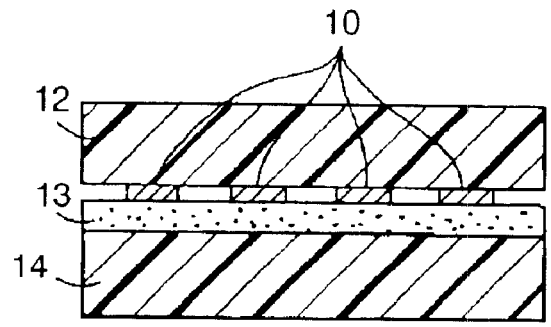
FIG. 5A shows a temporary fixing substrate bonded on a substrate with thin film piezoelectric elements formed thereon during the manufacturing method of the first exemplary embodiment of the present invention.

Adhesive is applied to surfaces of thin film piezoelectric elements 10 of the substrate 12, on which are formed the thin film piezoelectric elements 10 (shaped as in FIG. 3E) with specified processing completed. After forming adhesive layer 13, the piezoelectric elements 10 are bonded to temporary fixing substrate 14, as shown in FIG. 5A.

Figure 5B:
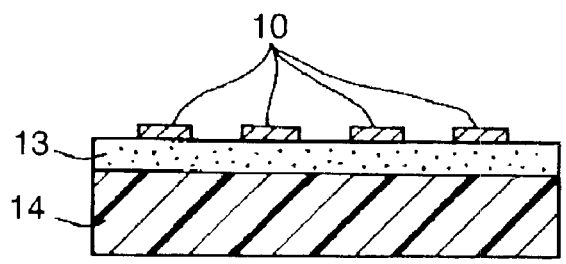
FIG. 5B shows a state with the substrate removed by etching during the manufacturing method of the first exemplary embodiment of the present invention.

After bonding the piezoelectric elements 10 to the temporary fixing substrate 14, the substrate 12 is removed by etching as shown in FIG. 5B. In so doing, it is necessary to select an etching solution or gas, or materials for adhesive layer 13 and temporary fixing substrate 14, so that the thin film piezoelectric elements 10, adhesive layer 13, and temporary fixing substrate 14 are not etched by the etching solution or gas used for etching the substrate 12. As adhesive for the adhesive layer 13, for example, when an MgO substrate or silicon mono-crystalline substrate is used as the substrate 12, it is possible to use paste-form adhesive, sheet-form adhesive, tar wax or the like, having thermal plasticity. Further, in order to prevent the adhesive layer 13 from deterioration due to a chemical solution used for etching the substrate 12, it is preferable to employ the following configuration. That is, a first material that is not deteriorated by the chemical solution is formed on a surface coming into contact with the thin film piezoelectric elements 10, and a second material having thermal plasticity is formed on the first material, thereby forming the adhesive layer 13 as a two-layer structure. In this case, as the first material, negative or positive photo-resist can be used. Also, as the second material, it is preferable to use adhesive having thermal plasticity as described above.

However, the chemical solution is sometimes heated when etching the substrate 12, and therefore, as photo-resist or thermoplastic adhesive, it is necessary to select a material which does not bubble when the adhesive layer 13 is heated.

Also, since the thin film piezoelectric elements 10 are about 10 μm in thickness, if the adhesive layer 13 is thinner than 100 μm, it is sometimes not possible to evenly cover entire surfaces of the thin film piezoelectric elements 10. On the other hand, if the adhesive layer 13 is thicker than 200 μm, much time would be required for dissolving and removing the adhesive layer 13, thereby greatly lowering mass-productivity. Accordingly, thickness of adhesive layer 13 is desirable to be in a range from 100 μm to 200 μm.

Due to the above procedure, the thin film piezoelectric elements 10 are separated from the substrate 12, but they are not separated into loose pieces because of being secured by the adhesive layer 13 to the temporary fixing substrate 14.

Figure 5C:
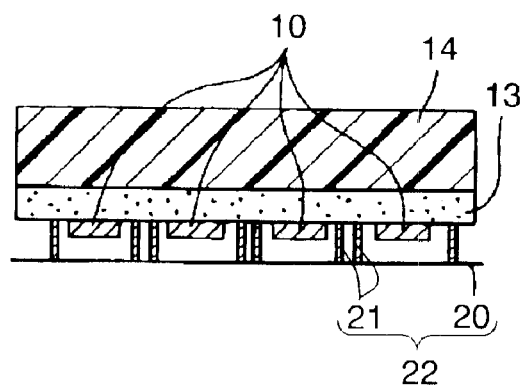
FIG. 5C shows an element housing jig fixed on an adhesive layer during the manufacturing method of the first exemplary embodiment of the present invention.

Next, in using an element housing jig 22 capable of individually housing the thin film piezoelectric elements 10 on the temporary fixing substrate 14, partition walls 21 as projections are bonded and secured to the adhesive layer 13, Heating a surface of the adhesive layer 13 before bonding the partition walls 21 thereto will make it easier to bond the partition walls to the adhesive layer. This is shown in FIG. 5C.

Figure 5D:
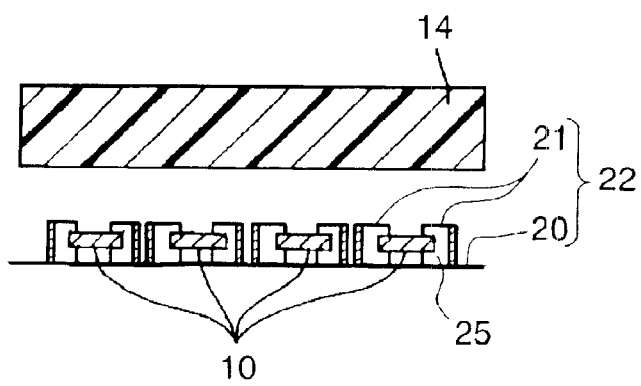
FIG. 5D shows a state with the adhesive layer removed during the manufacturing method of the first exemplary embodiment of the present invention.

Subsequently, with the element housing jig 22 secured on the adhesive layer 13, the entire structure including the temporary fixing substrate 14 is immersed into a chemical solution for dissolving the adhesive layer 13 with the element housing jig 22 at a lowermost position. During this immersion, the adhesive layer 13 is dissolved and removed, causing the thin film piezoelectric elements 10 to be separated from the temporary fixing substrate 14. At this time, as shown in FIG. 5D, the thin film piezoelectric elements 10 separated from the temporary fixing substrate 14 are individually held in each sectional region 25 defined by the partition walls 21 of the element housing jig 22.

Figure 6A:
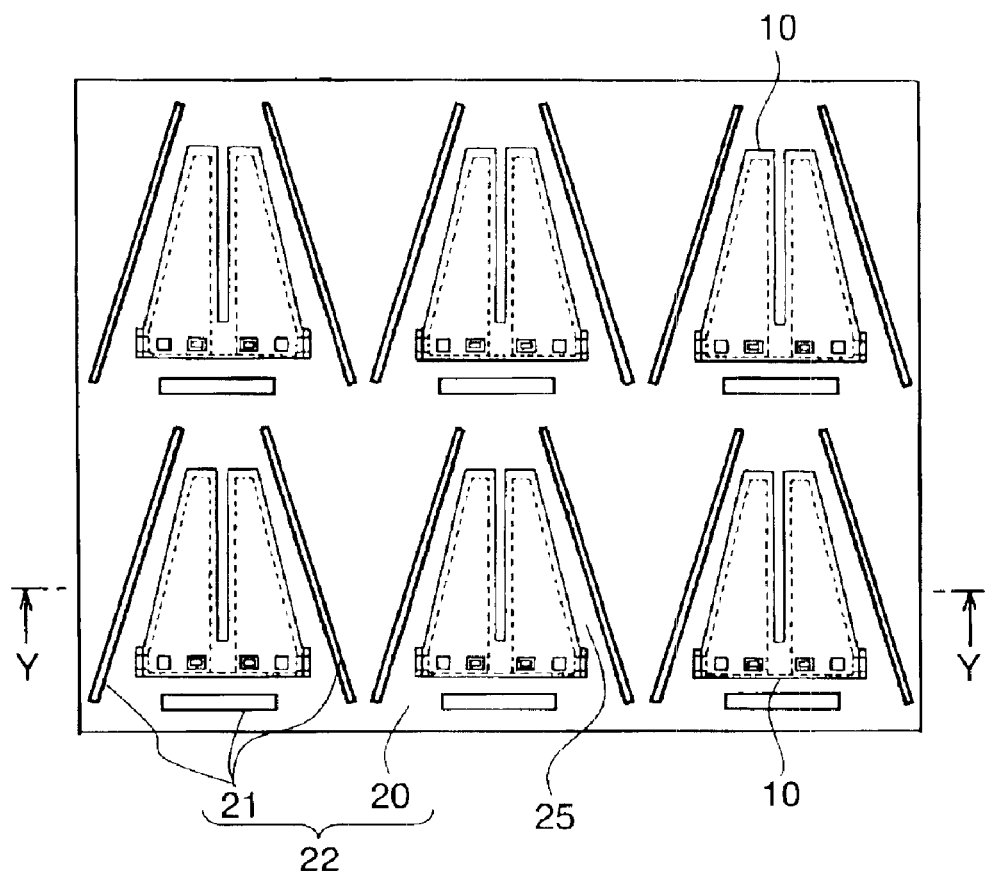
FIG. 6A shows thin film piezoelectric elements housed in sectional regions of the element housing jig during the manufacturing method of the first exemplary embodiment of the present invention.
Figure 6B:
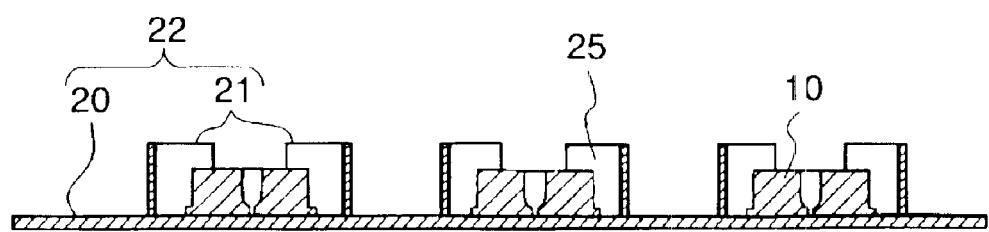
FIG. 6B is a sectional view along the Y—Y line shown in FIG. 6A.

FIG. 6A is a plan view showing a state in which each thin film piezoelectric element 10 is housed in a sectional region 25 of the element housing jig 22 after the adhesive layer 13 is removed by being dissolved. FIG. 6B is a sectional view along the Y—Y line of FIG. 6A. The element housing jig 22 is formed of flat-form base portion 20 and the partition walls 21 in accordance with an arrangement pitch of the thin film piezoelectric elements 10. Adjacent partition walls 21 define a spacing therebetween that reduces in width from one side toward another side so as to correspond to a shape of the thin film piezoelectric elements 10. An additional partition wall 21 is disposed at a widest portion of the spacing, and a region thus created by the adjacent partition walls, the additional partition wall and the base portion corresponds to sectional region 25. With this configuration, each thin film piezoelectric element 10 is held in a sectional region 25 defined by the partition walls 21 and base portion 20, and thereby, arrangement of the piezoelectric elements on the substrate 12 can be maintained as it is. Also, the thin film piezoelectric elements 10 will not come into contact with each other.

Accordingly, the thin film piezoelectric elements 10 can be prevented from coming into contact with each other and being damaged in a chemical solution tank. Also, since the arrangement of the thin film piezoelectric elements 10 is completely the same as their arrangement on the substrate 12, it is possible to use results of inspections of the piezoelectric elements while on the substrate 12, and to mount only non-defective ones of the thin film piezoelectric elements 10 held by the element housing jig 22.

The chemical solution for dissolving the adhesive layer 13, as is seen in FIG. 5C and FIG. 6A, may sufficiently flow through gaps between the base portion 20 and the thin film piezoelectric elements 10, such that the adhesive layer 13 formed over entire surfaces of the piezoelectric elements can be evenly and easily dissolved.

Also, in the present exemplary embodiment, as projections for forming sectional regions 25 for individually isolating and arranging the thin film piezoelectric elements 10 on the element housing jig 22, plate-form partition walls 21 are used, but the present invention is not limited to this configuration. For example, as projections, a plurality of pins can be disposed in an upright position for restricting movement of the thin film piezoelectric elements 10.

Second Exemplary Embodiment

In a second exemplary embodiment, a manufacturing method to be described is such that a temporary fixing substrate is provided with slits corresponding to projections of an element housing jig, and by using the temporary fixing substrate, thin film piezoelectric elements are separated from the substrate and housed in the element housing jig. Also in the present exemplary embodiment, description will be given with respect to a case of paired thin film piezoelectric elements as described with regard to the first exemplary embodiment. The same elements as those in FIG. 1 to FIG. 6B are given same reference numerals.

Figure 7:
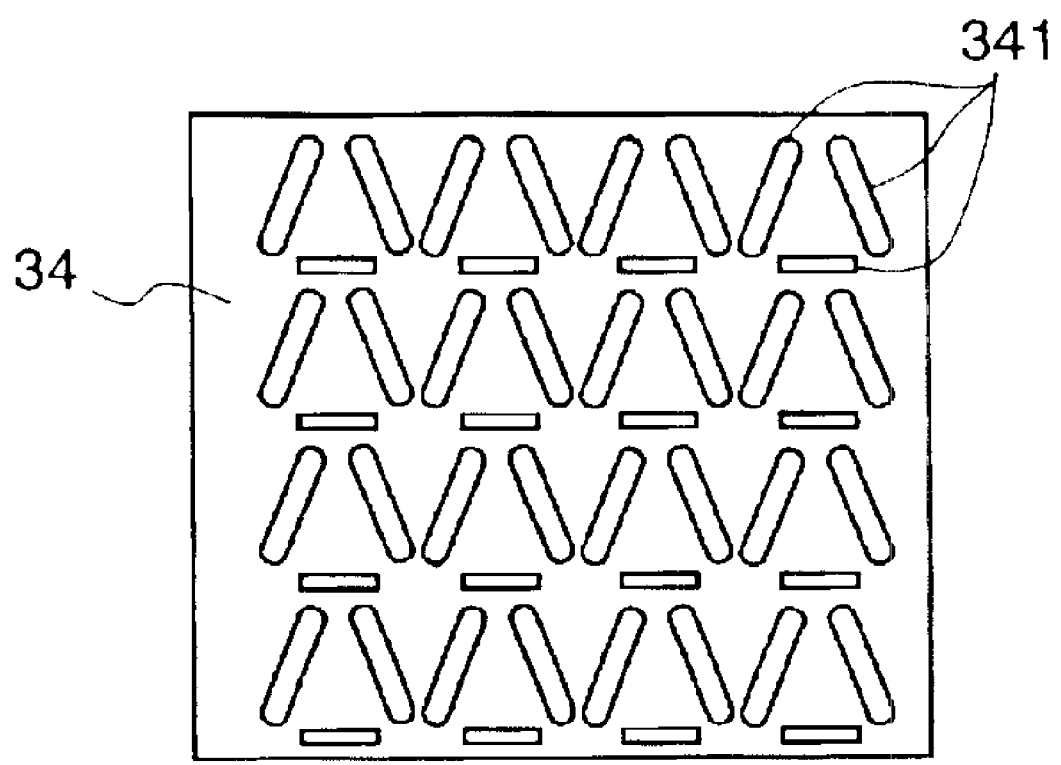
FIG. 7 is a pan view of a temporary fixing substrate used during a manufacturing method of a second exemplary embodiment of the present invention.

FIG. 7 is a plan view of temporary fixing substrate 34 provided with slits 341 corresponding to partition walls 21, which are projections of the element housing jig 22 used in the first exemplary embodiment. FIG. 8A to FIG. 8D are sectional views for description of steps during which thin film piezoelectric elements 10 are separated by using the temporary fixing substrate 34 and housed in the element housing jig 22.

Figure 8A:
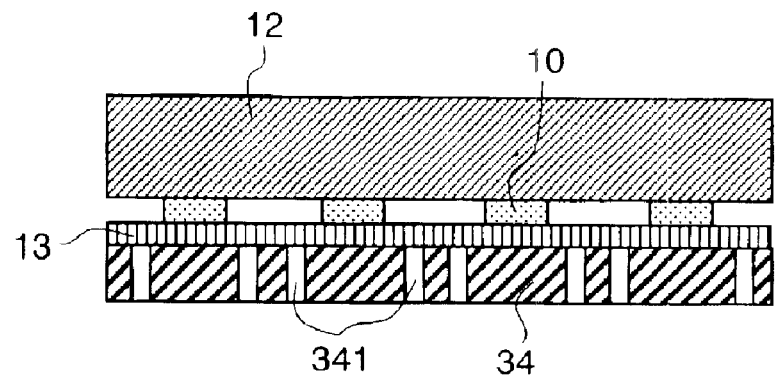
FIG. 8A shows the temporary fixing substrate bonded to a substrate with thin film piezoelectric elements formed thereon during the manufacturing method of the second exemplary embodiment of the present invention.

FIG. 8A shows that adhesive layer 13 is formed by applying adhesive to surfaces of the thin film piezoelectric elements 10 formed on substrate 12, and then bonded to the temporary fixing substrate 34. A difference between this step and that shown in FIG. 5A is that the temporary fixing substrate 34 provided with slits 341 is employed in the present exemplary embodiment.

Figure 8B:
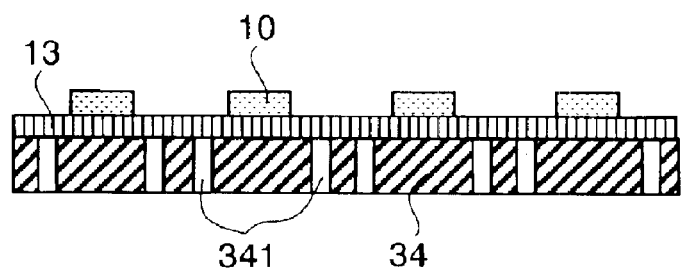
FIG. 8B shows a state with the substrate removed by etching during the manufacturing method of the second exemplary embodiment of the present invention.

After bonding of the temporary fixing substrate 34, the substrate 12 is removed by etching as shown in FIG. 8B. In so doing, it is necessary to select an etching solution or gas, or materials for adhesive layer 13 and temporary fixing substrate 34, so that the thin film piezoelectric elements 10, adhesive layer 13 and temporary fixing substrate 34 are not etched by the etching solution or gas used for etching the substrate 12, similar to the first exemplary embodiment. Also, a similar material can be used as the adhesive. Due to this procedure, the thin film piezoelectric elements 10 are separated from the substrate 12, but they are not separated into loose pieces because of being secured by the adhesive layer 13 to the temporary fixing substrate 34.

Figure 8C:
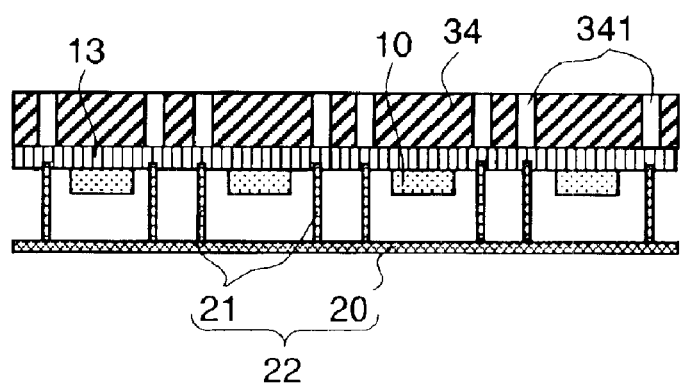
FIG. 8C shows a state of an element housing jig fixed on an adhesive layer the manufacturing method of the second exemplary embodiment of the present invention.

Next, by using the element housing jig 22, which is structurally capable of housing each of the thin film piezoelectric elements 10 bonded by the adhesive layer 13 onto the temporary fixing substrate 34, partition walls 21 are fixed to the substrate in such manner as to partially bite into the adhesive layer 13. This is shown in FIG. 8C. The partition walls 21 partially biting into the adhesive layer 13 enables a more reliable bonding and fixing of the partition walls to the temporary fixing substrate 34. It is also preferable to heat the adhesive layer 13 prior to the bonding or fixing thereof of the partition walls. The element housing jig 22 is the same as the one used in the first exemplary embodiment, and the partition walls 21 for individually housing the thin film piezoelectric elements 10 are formed on base portion 20 in the same arrangement as that of the thin film piezoelectric elements 10 on the temporary fixing substrate 34.

Figure 8D:
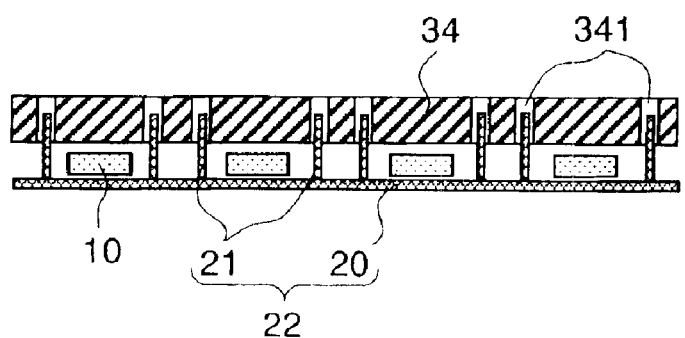
FIG. 8D shows a state with the adhesive layer dissolved and removed during the manufacturing method of the second exemplary embodiment of the present invention.

Thus, with the element housing jig 22 being fixed on the adhesive layer 13, the entire structure including the temporary fixing substrate 34 is immersed into a chemical solution for dissolving the adhesive layer 13 with the element housing jig 22 at a lowermost position. During this immersion, the adhesive layer 13 is dissolved and removed, causing the thin film piezoelectric elements 10 to be separated from the temporary fixing substrate 34. At this time, as shown in FIG. 8D, the partition walls 21 of the element housing jig 22 are fitted into the slits 341 due to weight of the temporary fixing substrate 34.

As a result, horizontal movement of the thin film piezoelectric elements 10 is restricted by the partition walls 21, and vertical movement of the piezoelectric elements is restricted by the base portion 20 and the temporary fixing substrate 34. Further, the chemical solution to dissolve the adhesive layer 13 flows therein through the slits 341 disposed in the temporary fixing substrate 34, and thus the adhesive layer 13 can be more quickly dissolved and removed.

As described above, it is possible to prevent the thin film piezoelectric elements 10 from coming into contact with each other, and being damaged, by using the element housing jig 22 which is capable of isolating and individually housing the thin film piezoelectric elements 10 removed from the substrate 12. Also, the element housing jig can be used as it is during cleaning and drying processes to be executed later, and therefore, it is possible to improve manufacturing yield of thin film piezoelectric elements, and also to simplify a manufacturing process thereof.

Third Exemplary Embodiment

Figure 9A:
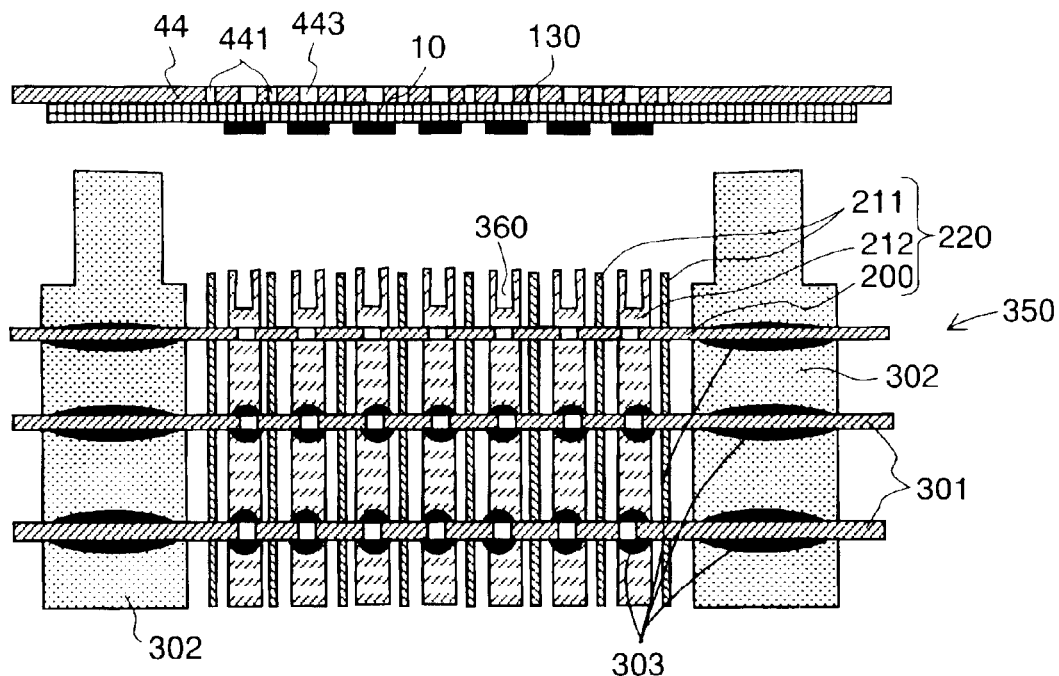
FIG. 9A shows a state before associating a temporary fixing substrate with an element housing section during a manufacturing method of a third exemplary embodiment of the present invention.

A third exemplary embodiment of the present invention is a manufacturing method in which an adhesive layer is removed by etching while a temporary fixing substrate is pressed in a direction of an element housing section, and an element housing jig formed from the temporary fixing substrate is employed FIG. 9A is a sectional view showing a state of temporary fixing substrate 44 with thin film piezoelectric elements 10 bonded thereto by adhesive layer 130 before being combined with element housing jig 350. The thin film piezoelectric elements 10 are bonded by the adhesive layer 130 onto the temporary fixing substrate 44. The temporary fixing substrate 44 is provided with lengthwise slits 441, widthwise slits 442, and openings 443 for improving flow of a solution, which will be described later in detail.

The element housing jig 350 comprises two-stage reinforcing plates 301, posts 302 for fixing the reinforcing plates 301, and element housing portions 220. The reinforcing plates 301 are bonded by adhesive 303 onto the posts 302 disposed at four corners of the reinforcing plates. The element housing portions 220 are disposed above the reinforcing plates. The element housing portions 220 each comprises lengthwise partition walls 211 and widthwise partition walls 212 as projections, and flat-form base portion 200. Four corners of the base portion 200 are fixed to the posts 302, thereby securing the entire structure. A region surrounded by a lengthwise partition wall 211 and a widthwise partition wall 212 is sectional region 360. Plates forming the lengthwise partition walls 211 and the widthwise partition walls 212 are extended downwardly through via-holes (not shown) provided in the reinforcing plates 301, and are secured by adhesive 303 in via-hole portions of the reinforcing plates 301. By so doing, the lengthwise partition walls 211 and the widthwise partition walls 212 are secured at designated positions.

Figure 9B:
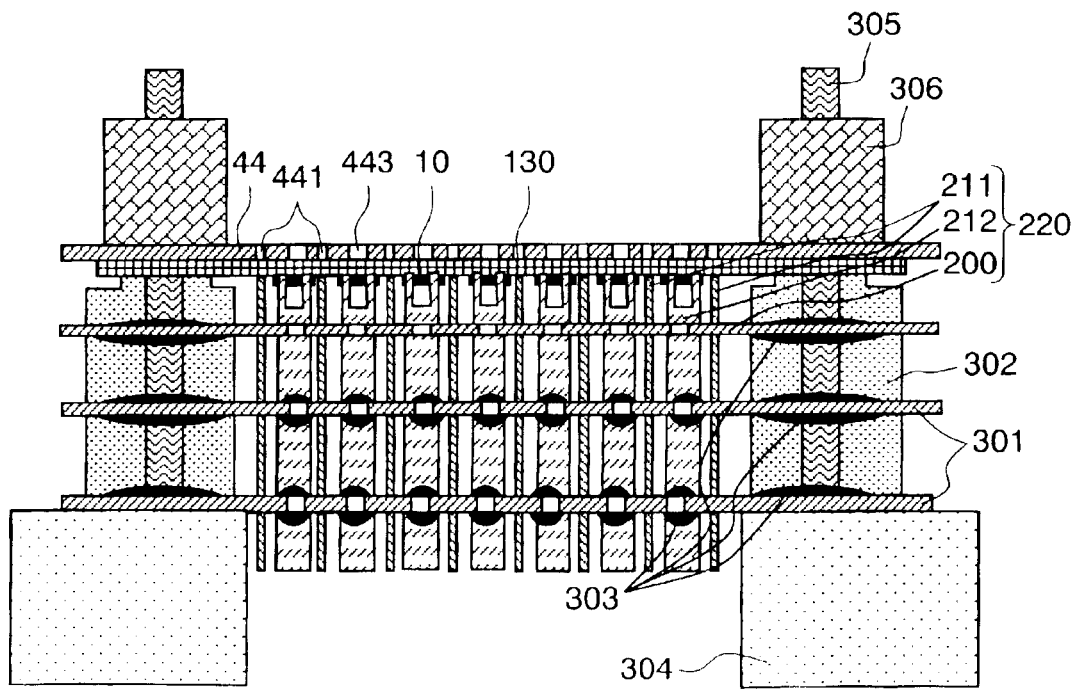
FIG. 9B shows a state of the temporary fixing substrate associated with and screwed to the element housing section during the manufacturing method of the third exemplary embodiment of the present invention.
Figure 9C:
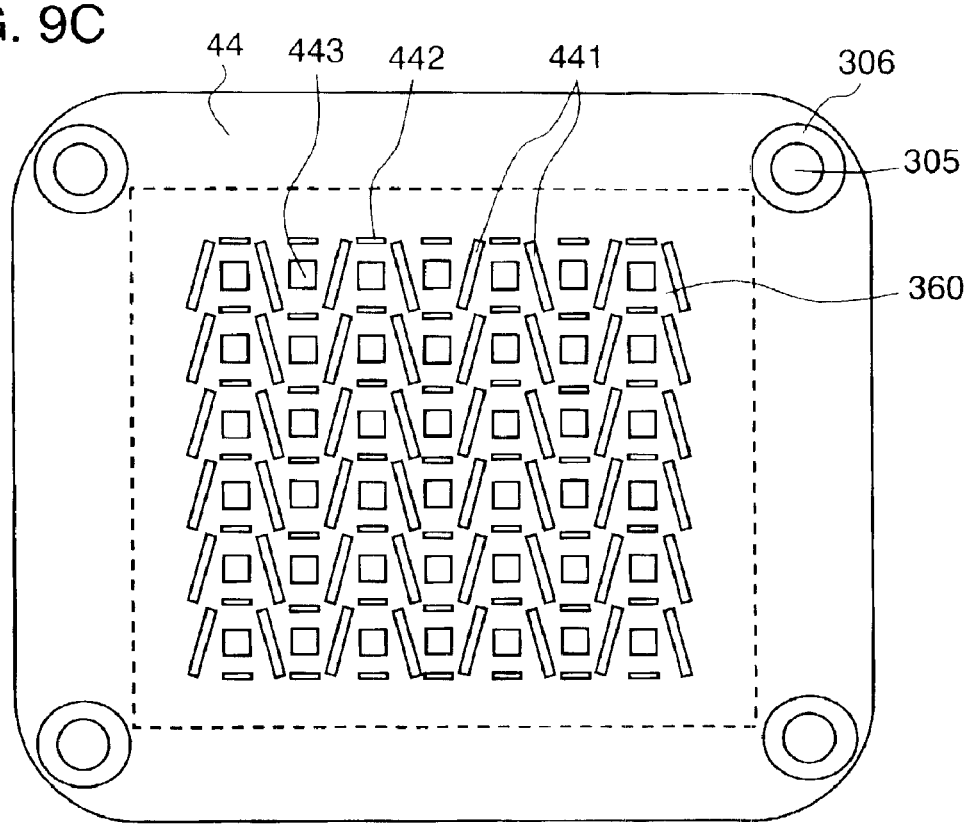
FIG. 9C is a plan view of an element housing jig shown in FIG. 9B.

In FIG. 9B, the temporary fixing substrate 44, with the thin film piezoelectric elements 10 bonded thereto, is fixed in the element housing jig 350, and then bolts 305 are inserted into via-holes (not shown) provided in the posts 302, which bolts are secured by nuts 304, 306 from either side. FIG. 9C is a plan view as viewed from above the temporary fixing substrate 44 in a state of being secured. The temporary fixing substrate 44 is provided with the lengthwise slits 441 corresponding to the lengthwise partition walls 211 of the element housing jig 350, and the widthwise slits 442 corresponding to the widthwise partition walls 212. With the adhesive layer 130 dissolved, the lengthwise partition walls 211 are fitted into the lengthwise slits 441, while the widthwise partition walls 212 are fitted into the widthwise slits 442. Further, the sectional regions 360 of the temporary fixing substrate 44 are also provided with openings 443 for making easier flow of solutions such as a chemical solution and cleaning water. Either one of the nuts 304, 306 is fastened via a pressure applying member such as a spring (not shown). Rubber or the like can be used instead of a spring as the pressure applying member.

Figure 9D:
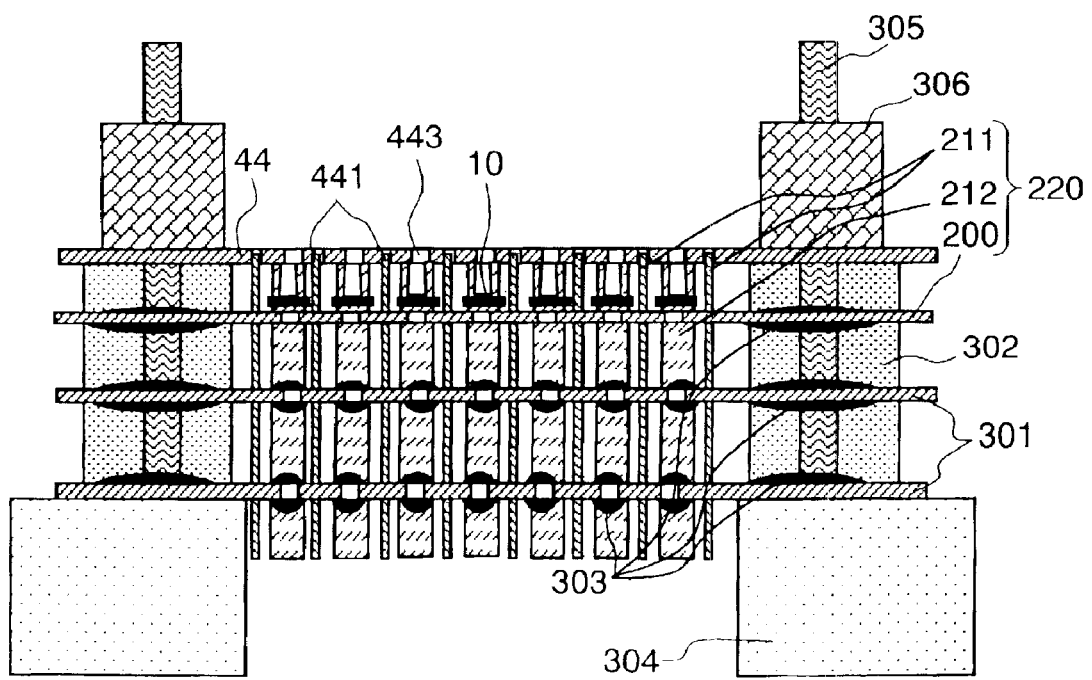
FIG. 9D shows a state with adhesive layer dissolved and removed during the manufacturing method of the third exemplary embodiment of the present invention.
Figure 9E:
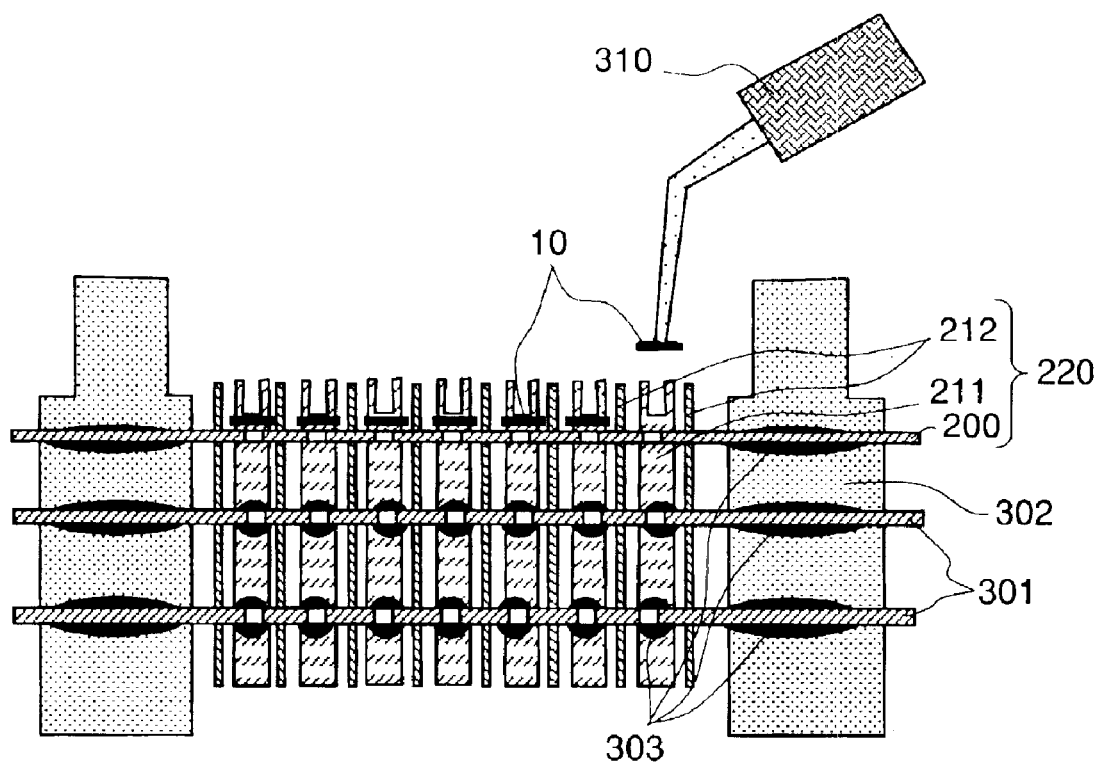
FIG. 9E shows a state with the temporary fixing substrate removed during the manufacturing method of the third exemplary embodiment of the present invention.
Figure 10:
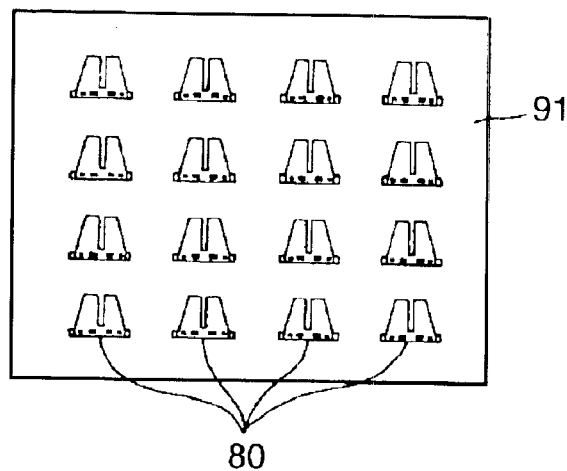
FIG. 10 shows a plurality of thin film piezoelectric elements formed on a substrate in a conventional manufacturing method.
Figure 11A:
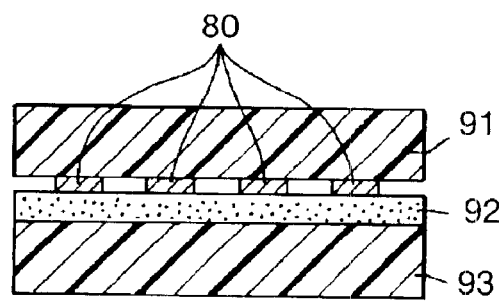
FIG. 11A shows a state of a temporary fixing substrate bonded during the conventional manufacturing method.
Figure 11B:
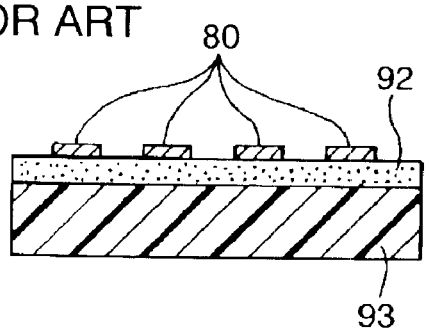
FIG. 11B shows a state with the substrate removed by etching during the conventional manufacturing method.
Figure 11C:
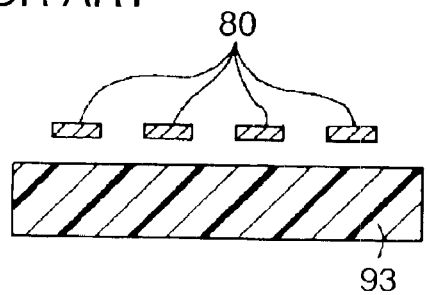
FIG. 11C shows a state with an adhesive layer dissolved and removed during the conventional manufacturing method.

In FIG. 9D, the entire structure shown in FIG. 9B is immersed in a chemical solution, thereby removing the adhesive layer 130. When the adhesive layer 130 is dissolved, the spring (not shown) functions to move the temporary fixing substrate 44 closer to the element housing portions 220. Simultaneously, the lengthwise partition walls 211 and the widthwise partition walls 212 are respectively fitted into the lengthwise slits 441 and the widthwise slits 442. As a result, upon removal of the adhesive layer 130, each of the thin film piezoelectric elements 10 is precisely held in one of the sectional regions 360 and will not come out of its corresponding sectional region 360 even if the element housing jig 350 is moved to the right and left. Accordingly, there will arise no problems of damage or overlap trouble of the thin film piezoelectric elements 10 during cleaning and rinsing operations, with use of various chemical solutions, after removal of the adhesive layer 130.

After cleaning the thin film piezoelectric elements 10, with the nuts 304, 306 and the temporary fixing substrate 44 removed, the thin film piezoelectric elements 10, in a state of being arranged as on substrate 12, can be obtained on the element housing portions 220. Therefore, according to results of characteristic inspection of the piezoelectric elements 10 while on substrate 12, the thin film piezoelectric elements 10 can be easily mounted on a substrate, such as a flexure, by chucking only non-defective ones of the piezoelectric elements by virtue of vacuum chuck 310, and thereby, a mounting operation can be remarkably simplified.

In the present exemplary embodiment, the lengthwise partition wall 211 and the widthwise partition wall 212 are of a plate-form, but the present invention is not limited to this configuration. Pins disposed to be upright, or plates spaced apart and disposed to be upright, can also be used, and there are no particular limitations provided that movement of the thin film piezoelectric elements 10 can be restricted and that partition walls are fitted into the slits of the temporary fixing substrate 44.

Also, the present invention is not limited to the paired thin film piezoelectric elements described in the first exemplary embodiment to the third exemplary embodiment, and similar effects can be realized with respect to a single thin film piezoelectric element as well. Further, the present invention is not limited to a thin film piezoelectric element with such structure that a thin film piezoelectric material and an electrode layer, formed on two sheets of substrates, are laminated by bonding with adhesive as described in the present exemplary embodiments. Similar effects can be obtained even in the case of thin film piezoelectric elements formed on one sheet of substrate. Moreover, regarding shape of the element housing jig and configuration of slits of the temporary fixing substrates, the present invention is not limited to the structure of the present exemplary embodiments. For example, via-holes can be provided in the base portion of the element housing jig to promote passage of a chemical solution. Also, the element housing jig can be provided with projections which restrict movement of the thin film piezoelectric elements, and a temporary fixing substrate provided with via-holes in positions corresponding to the projections can be used. As described above, there are no particular limitations on the structure, provided that the gist of the present invention resides therein.

Further, though the element housing jig of the present invention is used for manufacture of thin film piezoelectric elements described in the present exemplary embodiments, it is also possible to similarly use the element housing jig for manufacture of other thin film elements which are separated from a substrate.

DESCRIPTION OF REFERENCE NUMERALS

2 First thin film piezoelectric material
3 First electrode layer
4 Third electrode layer
5 Second thin film piezoelectric material
6 Fourth electrode layer
7 Second electrode layer
8,13,92,130 Adhesive layer
9 Coating resin
10,80 Thin film piezoelectric element
11,12,91 Substrate
14,34,44,93 Temporary fixing substrate
20,200 Base portion
21 Patittion wall (projection)
22 Element housing jig
25,360 Sectional region
101 Right piezoelectric element
102 Left piezoelectric element
103,104,105,106 Electrode terminal
211 Lengthwise partition wall
212 Widthwise partition wall
220 Element housing portion
301 Reinforcing plate
302 Post
303 Adhesive
304,306 Nut
305 Bolt
310 Vacuum chuck
341 Slit
350 Element housing section
441 Lengthwise slit
442 Widthwise slit
443 Opening
911 Connecting portion

What is claimed is:

1. A method of manufacturing thin film piezoelectric elements, comprising:

bonding a plurality of thin film piezoelectric elements, formed on a substrate, onto a temporary fixing substrate via an adhesive layer, thereby holding said thin film piezoelectric elements between said substrate and said temporary fixing substrate;

selectively removing said substrate so as to expose said thin film piezoelectric elements;

fixing an element housing jig, having sectional regions for individually isolating said thin film piezoelectric elements, in such a manner that said thin film piezoelectric elements and said sectional regions correspond to each other; and dissolving and removing said adhesive layer, thereby causing said thin film piezoelectric elements to be housed in said sectional regions of said element housing jig.

2. The method of manufacturing thin film piezoelectric elements according to claim 1, wherein each of said sectional regions comprises a region defined by a base portion of said element housing jig and portions extending from said base portion, and fixing an element housing jig in such a manner that said thin film piezoelectric elements and said sectional regions correspond to each other comprises bonding a part of said portions to said adhesive layer.

3. The method of manufacturing thin film piezoelectric elements according to claim 1, wherein each of said sectional regions comprises a region surrounded by a base portion of said element housing jig and projections extending from said base portion, and fixing an element housing jig in such a manner that said thin film piezoelectric elements and said sectional regions correspond to each to other comprises partially inserting a part of said projections into said adhesive layer.

4. The method of manufacturing thin film piezoelectric elements according to claim 1, wherein said adhesive layer comprises one of a paste-layer having thermal plasticity and a sheet layer having thermal plasticity.

5. The method of manufacturing thin film piezoelectric elements according to claim 1, wherein selectively removing said substrate comprises etching said substrate with an etching fluid.

6. The method of manufacturing thin film piezoelectric elements according to claim 5, wherein said adhesive layer comprises a first material layer that is not subject to deterioration via said etching fluid and is in contact with said thin film piezoelectric elements, and a second material layer that has thermal plasticity and is formed on said first material layer.

7. The method of manufacturing thin film piezoelectric elements according to claim 1, wherein said temporary fixing substrate is provided with at least one opening that is smaller than each of said thin film piezoelectric elements, and is provided adjacent to a corresponding one of said sectional regions.

8. The method of manufacturing thin film piezoelectric elements according to claim 1, wherein said element housing jig is provided with at least one opening adjacent to a corresponding one of said sectional regions, with said at least one opening being smaller than each of said thin film piezoelectric elements.

9. The method of manufacturing thin film piezoelectric elements according to claim 1, wherein each of said sectional regions comprises a region defined by a base portion of said element housing jig and portions extending from said base portion, and said temporary fixing substrate has fitting portions which are to receive said portions extending from said base portion, said method further comprising:

receiving said portions extending from said base portion within said fitting portions after dissolving and removing said adhesive layer.

10. The method of manufacturing thin film piezoelectric elements according to claim 9, wherein fixing an element housing jig in such a manner that said thin film piezoelectric elements and said sectional regions correspond to each other comprises arranging said temporary fixing substrate at a position according to said portions extending from said base portion, and applying a pressing force to said temporary fixing substrate.

* * * * *